US010885947B2

United States Patent
Kim

(10) Patent No.: US 10,885,947 B2
(45) Date of Patent: Jan. 5, 2021

(54) POWER GATING SYSTEM AND MEMORY SYSTEM INCLUDING THE POWER GATING SYSTEM

(71) Applicant: SK hynix Inc., Icheon-si (KR)

(72) Inventor: Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/445,831

(22) Filed: Jun. 19, 2019

(65) Prior Publication Data

US 2020/0143850 A1    May 7, 2020

(30) Foreign Application Priority Data

Nov. 5, 2018 (KR) .................. 10-2018-0134575

(51) Int. Cl.
*G11C 5/14* (2006.01)
*H03K 19/17772* (2020.01)
*H03K 19/173* (2006.01)

(52) U.S. Cl.
CPC .............. *G11C 5/147* (2013.01); *G11C 5/148* (2013.01); *H03K 19/1733* (2013.01); *H03K 19/17772* (2013.01)

(58) Field of Classification Search
CPC ..... G11C 5/147; G11C 11/4074; G11C 5/148; H03K 19/1733; H03K 19/17772
See application file for complete search history.

(56) References Cited

U.S. PATENT DOCUMENTS 7,612,615 B1    11/2009 Hou
2014/0313819 A1*   10/2014 Choi ................ G11C 11/417
                                                           365/156
2019/0027195 A1*    1/2019 Kim ................ G11C 11/4074

FOREIGN PATENT DOCUMENTS

KR    1020190107378 A    9/2019

* cited by examiner

*Primary Examiner* — David Lam
(74) *Attorney, Agent, or Firm* — William Park & Associates Ltd.

(57) ABSTRACT

A power gating system including: a first power line coupled to a first pad; a second power line coupled to a second pad; a third power line coupled to a plurality of logic gates in common; a first power gating switch coupled between the first and third power lines; and a second power gating switch coupled between the second and third power lines. When a double power mode is set, the first and second power gating switches may be turned on to couple the first and second power lines to the third power line at the same time.

17 Claims, 5 Drawing Sheets

| PDE | DUVDD | DVFSC | SW1 | SW2 | MODE |
|---|---|---|---|---|---|
| H | H | X | ON | ON | Dual VDD mode |
| | L | L | ON | OFF | High Frequency |
| | L | H | OFF | ON | Low Frequency |
| L | X | X | OFF | OFF | Power down mode active |
| | X | X | OFF | OFF | |
| | X | X | OFF | OFF | |

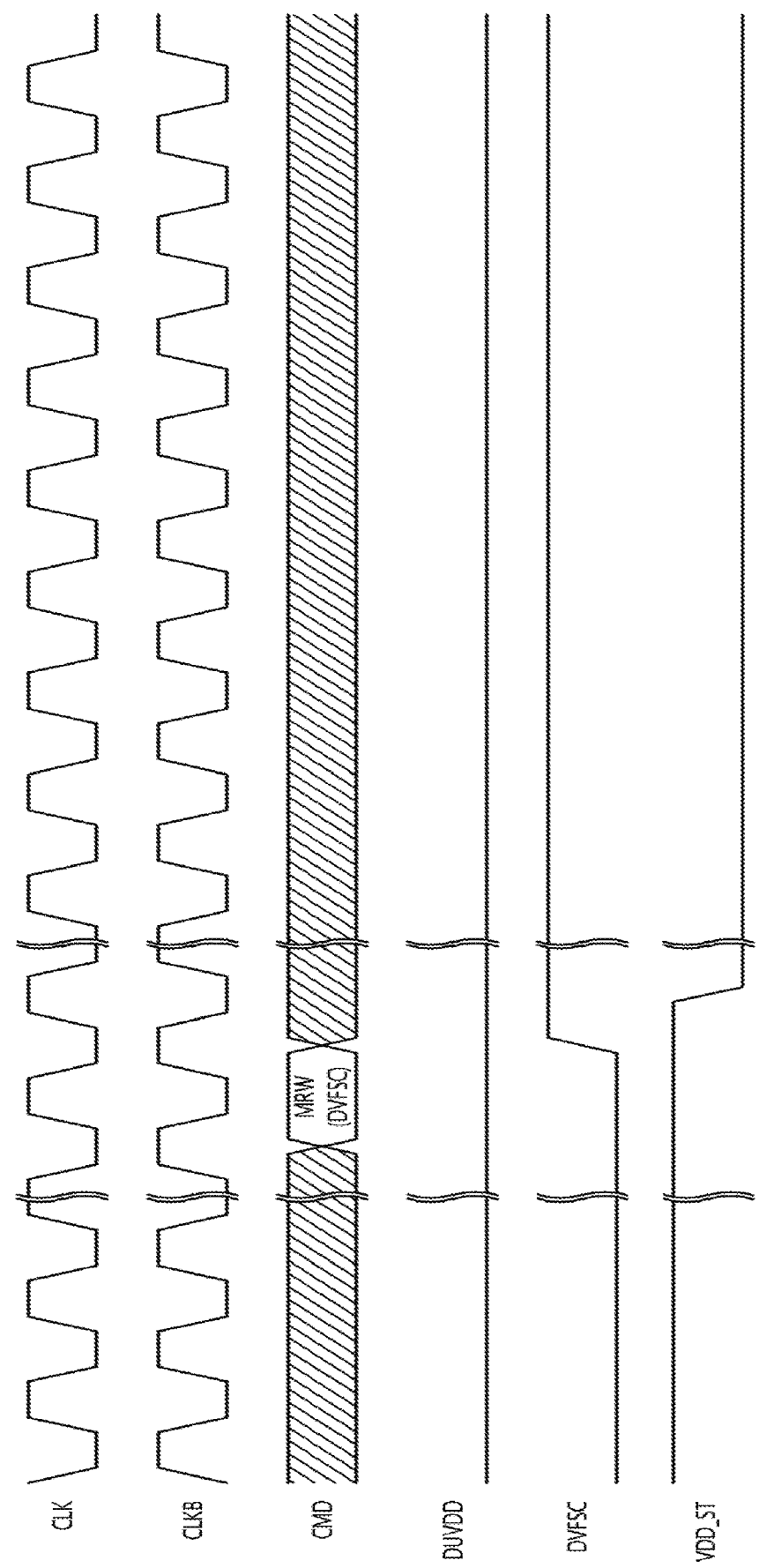

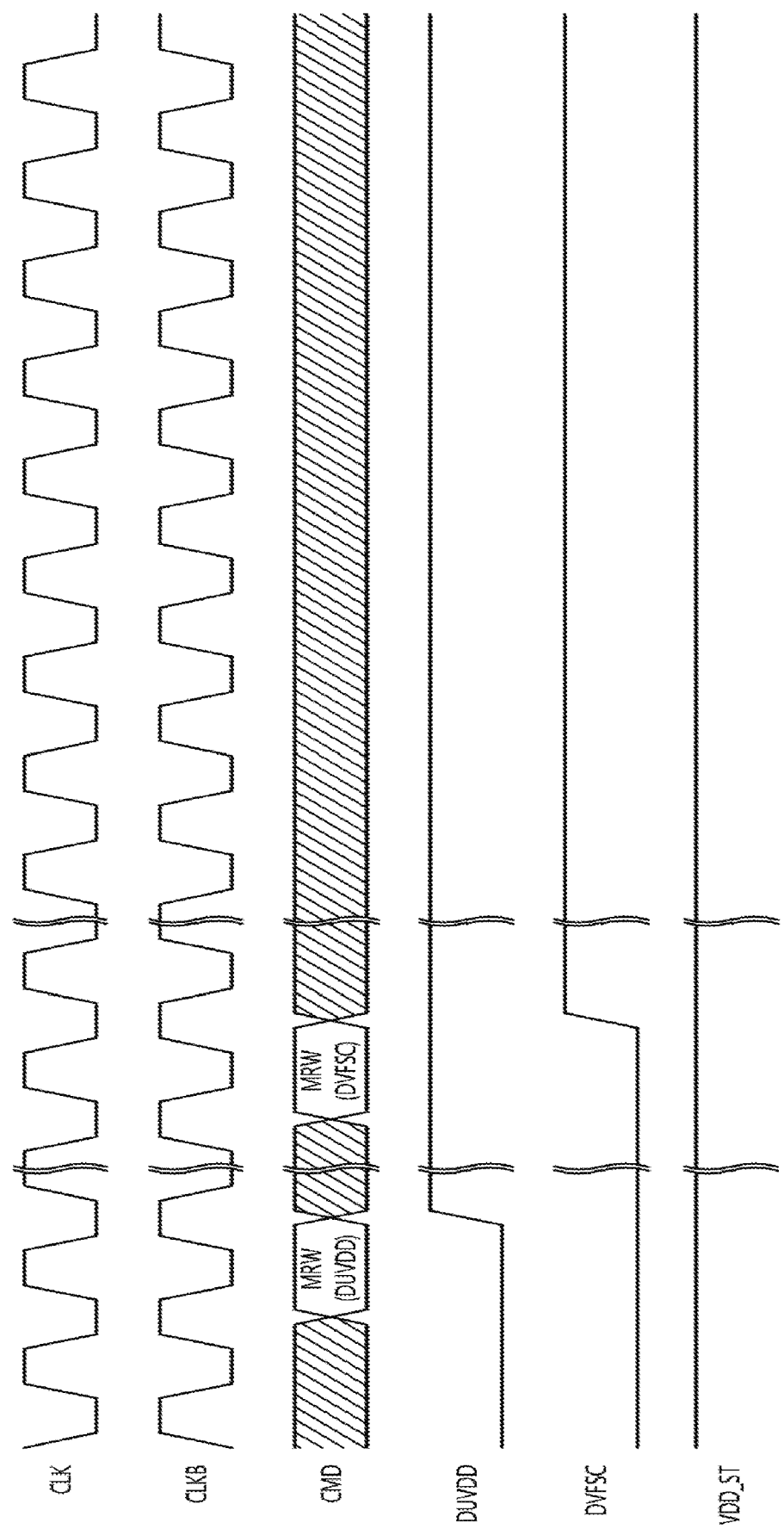

POWER GATING SYSTEM AND MEMORY SYSTEM INCLUDING THE POWER GATING SYSTEM

CROSS-REFERENCES TO RELATED APPLICATION

The present application claims priority under 35 U.S.C. § 119(a) to Korean application number 10-2018-0134575, filed on Nov. 5, 2018, in the Korean Intellectual Property Office, which is incorporated herein by reference in its entirety.

BACKGROUND

1. Technical Field

Various embodiments generally relate to a semiconductor circuit, and more particularly, to a power gating system and a memory system including the power gating system.

2. Related Art

Recently, electronic devices, for example, portable electronic devices have been reduced in size and weight, but the number of function blocks embedded in each of the portable electronic devices tends to continuously increase.

In particular, because the portable electronic device is operated by a limited power supply, i.e. a battery, the portable electronic device needs to reduce power which is unnecessarily consumed by function blocks in a power-down mode.

To this end, the electronic device employs a power gating technique for preventing unnecessary power supply to the function blocks in the power-down mode.

SUMMARY

In an embodiment, a power gating system may include: a first power line coupled to a first pad; a second power line coupled to a second pad; a third power line coupled to a plurality of logic gates in common; a first power gating switch coupled between the first and third power lines; and a second power gating switch coupled between the second and third power lines. When a double power mode is set, the first and second power gating switches may be turned on to couple the first and second power lines to the third power line at the same time.

In an embodiment, a memory system may include: a memory configured to selectively supply a first supply voltage applied through a first pad and a second supply voltage applied through a second pad to a plurality of logic gates therein when a DVFS mode is set, and supply the first and second supply voltages to the plurality of logic gates at the same time when a double power mode is set; and a processor configured to supply the first and second supply voltages at different levels to the memory when the memory is set in the DVFS mode, and supply the first and second supply voltages at the same level or substantially the same level to the memory when the memory is set in the double power mode.

In an embodiment, a memory system may include: a memory configured to selectively supply a first supply voltage applied through a first pad and a second supply voltage applied through a second pad to a plurality of logic gates therein at the same time when a double power mode is set; and a processor configured to supply the first and second supply voltages at substantially the same level to the memory when the memory is set in the double power mode.

BRIEF DESCRIPTION OF THE DRAWINGS

FIGS. 6 and 7 are timing diagrams illustrating examples of the power gating operation in accordance with the present embodiments.

DETAILED DESCRIPTION

Hereinafter, a power gating system and a memory system including the same according to the present disclosure will be described below with reference to the accompanying drawings through embodiments.

An electronic device may require a technique capable of controlling power supply for a stable operation in addition to the power gating technology.

Figure 1:
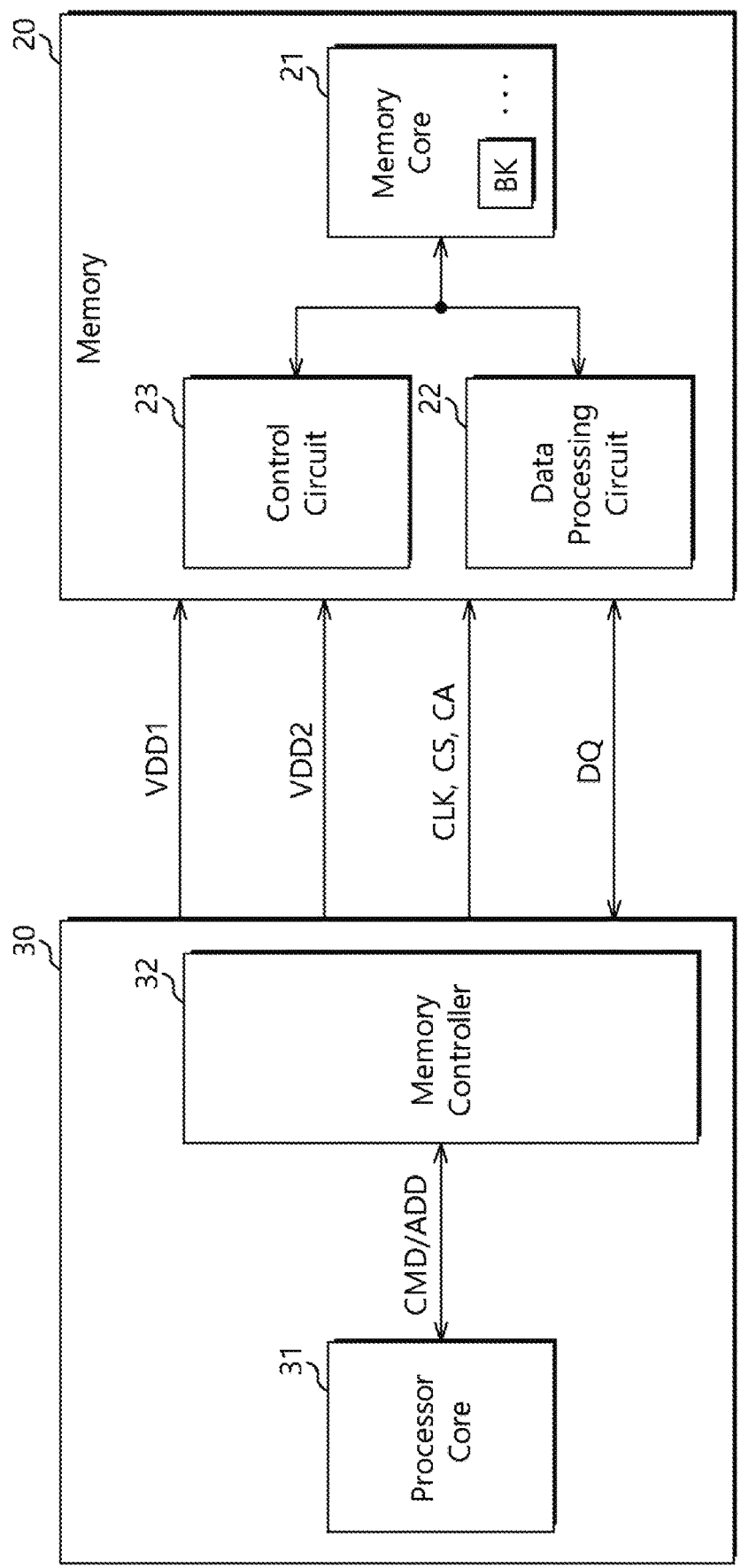
FIG. 1 illustrates a configuration of a memory system in accordance with an embodiment.

Referring to FIG. 1, a memory system 10 in accordance with an embodiment may include a memory 20 and a processor 30.

The processor 30 may include a central processing unit (CPU) or a graphic processing unit (GPU), etc.

The processor 30 may provide the memory 20 with a first supply voltage and a second supply voltage at the same level or different levels through independent pads, and set an operation mode of the memory 20 to any one of a double power mode and a dynamic voltage frequency scaling (DVFS) mode or a combined operation mode thereof, using a command.

The double power mode may indicate an operation mode in which the processor 30 forces the first and second supply voltages to the same high voltage level, and controls the memory 20 to use the first and second supply voltages at the same time, thereby stably retaining a voltage level.

The DVFS mode may indicate an operation mode in which the processor 30 forces the first and second supply voltages to different levels, and controls the memory 20 to selectively use the first and second supply voltages according to an operating frequency, thereby reducing power consumption.

The processor 30 may set the operation mode of the memory 20 to any one of the double power mode and the DVFS mode or the combined operation mode thereof by changing a setting value of the double power mode and a setting value of the DVFS mode using a command, for example, a mode register write command.

The processor 30 may set the operation mode of the memory 20 to any one of the double power mode and the DVFS mode according to an application and system structure to which the memory system 10 is applied.

For example, the processor 30 may set the operation mode of the memory 20 to the DVFS mode when the system to which the memory system 10 is applied needs to reduce power consumption, and set the operation mode of the memory 20 to the double power mode when the system to which the memory system 10 is applied requires stable voltage supply.

The processor 30 may include a processor core 31 and a memory controller 32.

The processor core 31 may provide the memory controller 32 with various commands CMD and addresses ADD for controlling the memory 20.

The memory controller 32 may control the memory 20 by providing the memory 20 with a first supply voltage VDD1, a second supply voltage VDD2, a clock signal CLK, a chip select signal CS and a command/address signal CA according to the commands CMD and addresses ADD provided from the processor core 31.

The memory controller 32 may provide the memory 20 with the first and second supply voltages VDD1 and VDD2 at the same level or different levels.

The memory controller 32 may provide the memory 20 with the first and second supply voltages VDD1 and VDD2 at the same high voltage level, or provide the memory 20 with the first and second supply voltages VDD1 and VDD2 at the same low voltage level. A high level and a low level, as used herein with respect to signals, refer to logic levels of the signals. A signal having a low level distinguishes from the signal when it has a high level. For example, the high level may correspond to the signal having a first voltage, and the low level may correspond to the signal having a second voltage. For some embodiments, the first voltage is greater than the second voltage. In other embodiments, different characteristics of a signal, such as frequency or amplitude, determine whether the signal has a high level or a low level. For some cases, the high and low levels of a signal represent logical binary states.

The memory controller 32 may provide the memory 20 with the first supply voltage VDD1 at a high voltage level and the second supply voltage VDD2 at a low voltage level.

The memory controller 32 may transfer/receive data DQ to/from the memory 20.

The memory 20, i.e. a semiconductor memory, may include a memory core 21, a data processing circuit 22 and a control circuit 23.

The memory core 21 may include a plurality of unit memory areas, for example, memory banks BK and circuit components for data input/output of the memory banks BK.

The data processing circuit 22 may perform a data input/output related operation between the memory core 21 and the memory controller 32.

The control circuit 23 may control a data read/write operation and a power gating-related operation of the memory 20 according to the chip select signal CS and the command/address signal CA which are provided from the memory controller 32 of the processor 30.

Figure 2:
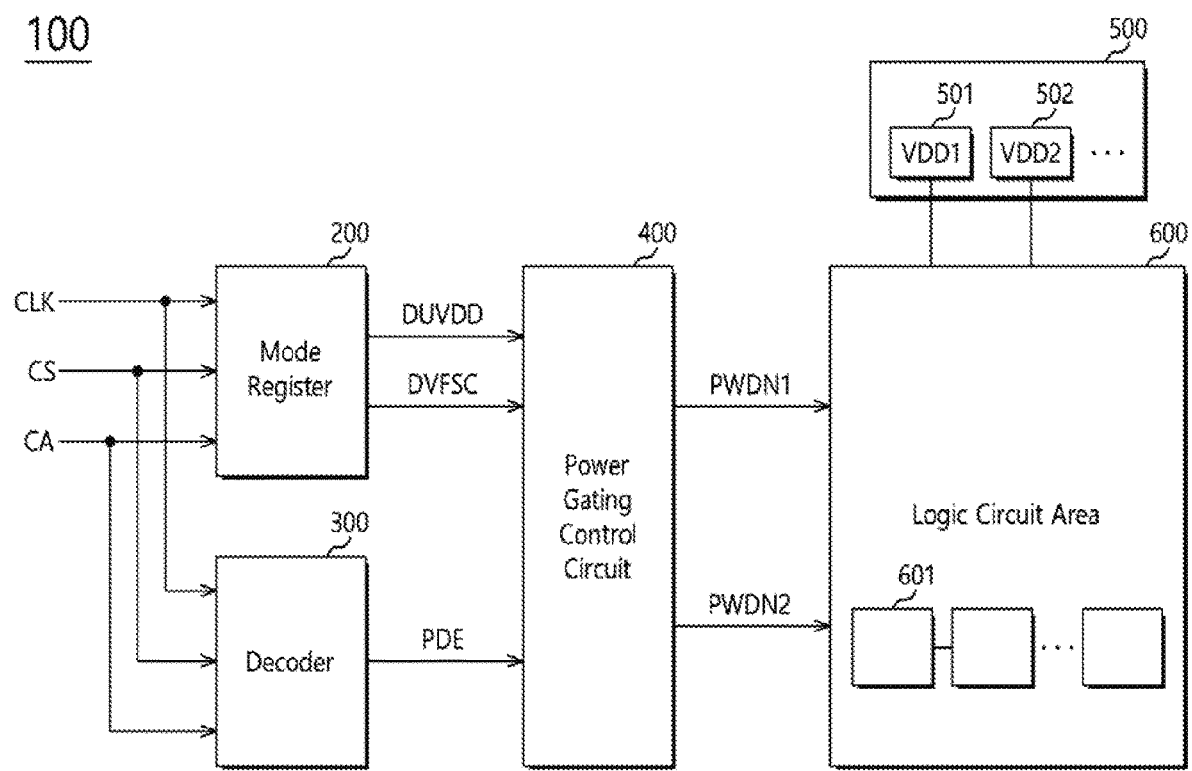
FIG. 2 illustrates a configuration of a power gating system in accordance with an embodiment.

FIG. 2 illustrates a configuration of a power gating system in accordance with an embodiment.

The power gating system 100 in accordance with an embodiment may be configured in the memory 20 of FIG. 1, for example.

As illustrated in FIG. 2, the power gating system 100 in accordance with an embodiment may include a mode register 200, a decoder 300, a power gating control circuit 400, a pad array 500 and a logic circuit area 600.

The mode register 200 may receive the clock signal CLK, the chip select signal CS and the command/address signal CA.

The mode register 200 may change the setting value of the double power mode and the setting value of the DVFS mode according to a mode register write command MRW generated by a combination of the chip select signal CS and the command/address signal CA.

Hereafter, in an embodiment, the setting value of the double power mode will be referred to as a double power mode setting signal DUVDD, and the setting value of the DVFS mode will be referred to as a DVFS mode setting signal DVFSC.

The decoder 300 may receive the clock signal CLK, the chip select signal CS and the command/address signal CA.

The decoder 300 may generate a power-down mode signal PDE by decoding a power-down command generated by a combination of the chip select signal CS and the command/address signal CA.

The pad array 500 may include a first pad 501 for receiving the first supply voltage VDD1 and a second pad 502 for receiving the second supply voltage VDD2.

The pad array 500 may further include pads for receiving various signals, in addition to the first and second pads 501 and 502.

The logic circuit area 600 may include a plurality of logic gates 601 which operate according to the first supply voltage VDD1 or/and the second supply voltage VDD2.

The power gating control circuit 400 may generate power gating control signals, for example, a first power gating control signal PWDN1 and a second power gating control signal PWDN2, according to the double power mode setting signal DUVDD, the DVFS mode setting signal DVFSC and the power-down mode signal PDE.

When the power-down mode signal PDE is at an active level, the power gating control circuit 400 may generate the first and second power gating control signals PWDN1 and PWDN2 at an active level, regardless of the levels of the double power mode setting signal DUVDD and the DVFS mode setting signal DVFSC.

The activation of the first and second power gating control signals PWDN1 and PWDN2 may indicate that the first and second supply voltages VDD1 and VDD2 are blocked from being supplied to the plurality of logic gates 601 of the logic circuit area 600.

When the power-down mode signal PDE is at an inactive level and the double power mode setting signal DUVDD is at an active level, the power gating control circuit 400 may generate the first and second power gating control signals PWDN1 and PWDN2 at an inactive level, regardless of the level of the DVFS mode setting signal DVFSC.

When both of the power-down mode signal PDE and the double power mode setting signal DUVDD are at an inactive level, the power gating control circuit 400 may selectively activate the first and second power gating control signals PWDN1 and PWDN2 according to the level of the DVFS mode setting signal DVFSC.

Figure 3:
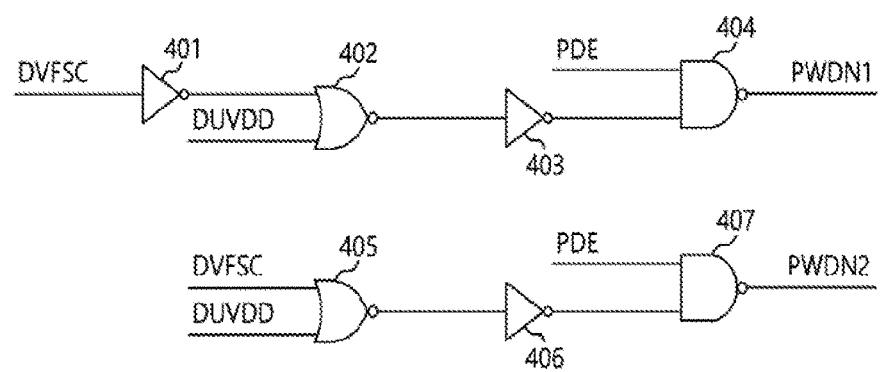
FIG. 3 illustrates a configuration of a power gating control circuit of FIG. 2.

FIG. 3 illustrates a configuration of the power gating control circuit of FIG. 2.

As illustrated in FIG. 3, the power gating control circuit 400 may include a plurality of logic gates, for example, first to seventh logic gates 401 to 407.

The first logic gate 401 may invert the DVFS mode setting signal DVFSC, and output the inverted signal.

The second logic gate 402 may perform a NOR operation on the output signal of the first logic gate 401 and the double power mode setting signal DUVDD, and output the operation result.

The third logic gate 403 may invert the output signal of the second logic gate 402, and output the inverted signal.

The fourth logic gate 404 may perform a NAND operation on the output signal of the third logic gate 403 and the power-down mode signal PDE, and output the operation result as the first power gating control signal PWDN1.

The fifth logic gate 405 may perform a NOR operation on the DVFS mode setting signal DVFSC and the double power mode setting signal DUVDD, and output the operation result.

The sixth logic gate 406 may invert the output signal of the fifth logic gate 405, and output the inverted signal.

The seventh logic gate 407 may perform a NAND operation on the output signal of the sixth logic gate 406 and the power-down mode signal PDE, and output the operation result as the second power gating control signal PWDN2.

Figures 4, 5:
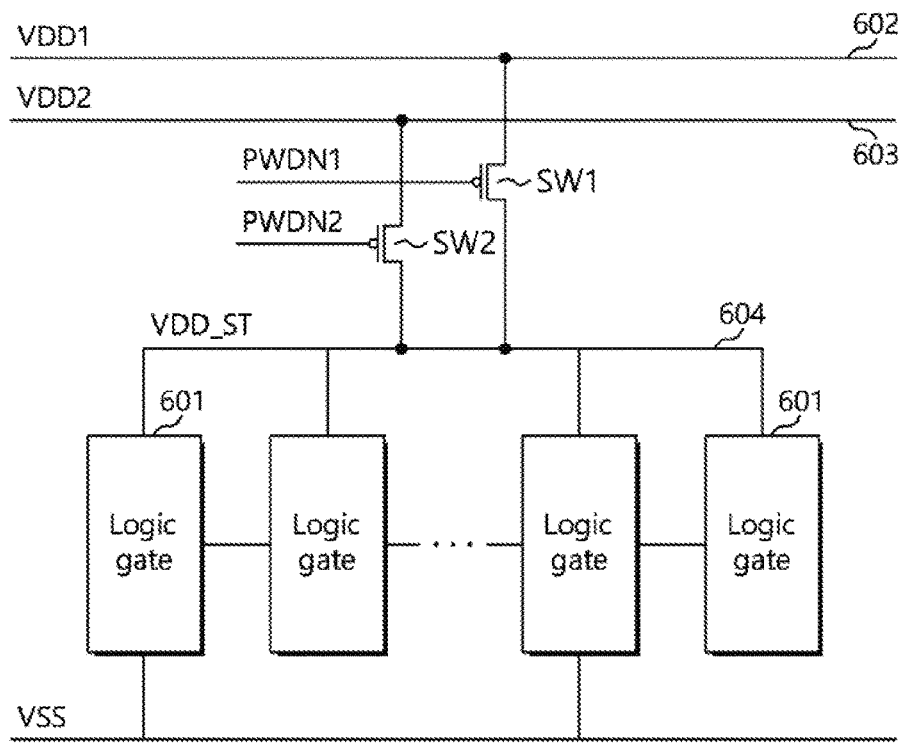
FIG. 4 illustrates a configuration of a logic circuit area of FIG. 2.
FIG. 5 is a truth table for describing a power gating operation in accordance with an embodiment.

FIG. 4 illustrates a configuration of the logic circuit area of FIG. 2.

As illustrated in FIG. 4, the logic circuit area 600 may include a plurality of logic gates 601, a first power gating switch SW1, a second power gating switch SW2 and first to third power lines 602 to 604.

The first power line 602 may be coupled to the first pad 501 of FIG. 2, and receive the first supply voltage VDD1.

The second power line 603 may be coupled to the second pad 502 of FIG. 2, and receive the second supply voltage VDD2.

The third power line 604 may be coupled to the plurality of logic gates 601 in common, and provide a third supply voltage VDD_ST to the plurality of logic gates 601.

The first power gating switch SW1 may be coupled between the first and third power lines 602 and 604, and electrically couple or separate the first and third power lines 602 and 604 to or from each other according to the first power gating control signal PWDN1.

The second power gating switch SW2 may be coupled between the second and third power lines 603 and 604, and electrically couple or separate the second and third power lines 603 and 604 to or from each other according to the second power gating control signal PWDN2. In an embodiment, the plurality of logic gates 601 may be coupled to a fourth power line 605. In some embodiments, the fourth power line 605 may supply a ground voltage VSS.

FIG. 5 is a truth table for describing a power gating operation in accordance with an embodiment, and FIGS. 6 and 7 are timing diagrams illustrating examples of the power gating operation in accordance with an embodiment.

Hereafter, referring to FIGS. 1 to 7, the power gating operation in accordance with an embodiment will be described as follows. FIGS. 6 and 7 also illustrate a clock signal CLK and an inverted clock signal CLKB.

First, the case in which the processor 30 operates the memory 20 in the DVFS mode will be taken as an example.

When the power-down mode is not enabled, the power-down mode signal PDE may be at an inactive level (for example, high level), and when the double power mode is not enabled, the double power mode setting signal DUVDD may be at an inactive level (for example, low level).

The DVFS mode setting signal DVFSC may have an inactive level (for example, low level) as a default value.

The processor 30 may retain the DVFS setting signal DVFSC at the default value, i.e. a low level, when the operating speed of the memory 20, i.e. an operating frequency is higher than a preset value, and activate the DVFS mode setting signal DVFSC to a high level using the mode register write command MRW, when the operating frequency of the memory 20 is lower than the preset value. The word "preset" as used herein with respect to a parameter, such as a preset period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The processor 30 may force the high-level first supply voltage VDD1 through the first pad 501 before enabling the double power mode, and force the second supply voltage VDD2 having a lower level than the first supply voltage VDD1 through the second pad 502.

When the DVFS mode setting signal DVFSC is at a low level as illustrated in FIG. 6, the first power gating control signal PWDN1 may be at a low level, and the second power gating control signal PWDN2 may be at a high level. Thus, the first power gating switch SW1 may be turned on, and the second power gating switch SW2 may be turned off.

As the first power gating switch SW1 is turned on, the high-level first supply voltage VDD1 may be supplied as the third supply voltage VDD_ST to the logic gates 601.

As described above, the processor 30 may activate the DVFS mode setting signal DVFSC to a high level using the mode register write command MRW, when the operating frequency of the memory 20 is lower than the preset value.

When the DVFS mode setting signal DVFSC is at a high level, the first power gating control signal PWDN1 may be at a high level, and the second power gating control signal PWDN2 may be at a low level. Thus, the first power gating switch SW1 may be turned off, and the second power gating switch SW2 may be turned on.

As the second power gating switch SW2 is turned on, the low voltage level second supply voltage VDD2 may be supplied as the third supply voltage VDD_ST to the logic gates 601.

Next, the case in which the processor 30 operates the memory 20 in the combined operation mode of the double power mode and the DVFS mode will be taken as an example.

When the power-down mode is not enabled, the power-down mode signal PDE may be at a high level, and when the double power mode is not enabled, the double power mode setting signal DUVDD may be at a low level.

Before the double power mode is enabled, the DVFSC mode setting signal DVFSC may have a low level corresponding to the default value as described with reference to FIG. 6. Thus, as the first power gating switch SW1 is turned on, the high-level first supply voltage VDD1 may be supplied as the third supply voltage VDD_ST to the logic gates 601.

As illustrated in FIG. 7, the processor 30 may set the double power mode setting signal DUVDD to a high level using the mode register write command MRW, and force the first and second supply voltages VDD1 and VDD2 to the same high voltage level through the first and second pads 501 and 502.

Because the power-down mode signal PDE and the double power mode setting signal DUVDD are at a high level, the first and second power gating control signals PWDN1 and PWDN2 may be all deactivated to a low level, regardless of the level of the DVFS mode setting signal DVFSC.

Because both of the first and second power gating control signals PWDN1 and PWDN2 are at a low level, the first and second power gating switches SW1 and SW2 may be turned on.

As the first and second power gating switches SW1 and SW2 are turned on, the first and second power lines 602 and 603 may be electrically coupled to the third power line 604.

Through the first and second power lines 602 and 603, the first and second supply voltages VDD1 and VDD2 having the same high voltage level may be applied to the third power line 604.

Therefore, the third supply voltage VDD_ST retained at the high voltage level may be stably supplied to the logic gates 601 through the third power line 604, regardless of an internal or external operation environment variation.

With the double power mode enabled, the processor 30 may detect that the operating frequency of the memory 20 is lower than the preset value, and activate the DVFS mode setting signal DVFSC at a high level using the mode register write command MRW.

However, because the power-down mode signal PDE and the double power mode setting signal DUVDD are at a high level, the first and second power gating switches SW1 and SW2 may be turned on regardless of the level of the DVFS mode setting signal DVFSC, and the third supply voltage VDD_ST which is stably retained at the high voltage level regardless of an internal or external operation environment variation may be supplied to the logic gates 601 through the third power line 604.

Next, the case in which the processor 30 operates the memory 20 in the power-down mode will be taken as an example.

As the processor 30 generates the power-down command, the power-down mode signal PDE may be activated to a low level.

When the power-down mode signal PDE is activated to a low level, both of the first and second power gating control signals PWDN1 and PWDN2 may be activated to a high level, regardless of the levels of the DVFS mode setting signal DVFSC and the double power mode setting signal DUVDD.

Because both of the first and second power gating control signals PWDN1 and PWDN2 are at a high level, the first and second power gating switches SW1 and SW2 may be turned off.

As the first and second power gating switches SW1 and SW2 are turned off, the first and second power lines 602 and 603 may be electrically separated from the third power line 604, thereby removing power to the logic gates 601.

While various embodiments have been described above, it will be understood to those skilled in the art that the embodiments described are examples only. Accordingly, the power gating system and the memory system described herein should not be limited based on the described embodiments.

What is claimed is:

1. A power gating system comprising:
   a first power line, which is provided a first supply voltage from a first pad;
   a second power line which is provided a second supply voltage from a second pad;
   a third power line coupled to a plurality of logic gates;
   a first power gating switch coupled between the first and third power lines; and
   a second power gating switch coupled between the second and third power lines,
   wherein when a double power mode is set, the first and second power gating switches are turned on to couple the first and second power lines to the third power line at the same time,
   wherein when a dynamic voltage/frequency scaling (DVFS) mode is set, one of the first supply voltage and the second supply voltage is supplied to the third power line;
   wherein when the double power mode is set, the first supply voltage and the second supply voltage are both supplied to the third power line;
   and wherein the first supply voltage and the second supply voltage have different voltage levels when the dynamic voltage/frequency scaling (DVFS) mode is set, and the first supply voltage and the second supply voltage have same voltage level when the double power mode is set.

2. The power gating system according to claim 1, wherein when the dynamic voltage/frequency scaling (DVFS) mode is set while the double power mode is not set, the first and second power gating switches are selectively turned on.

3. The power gating system according to claim 2, further comprising a mode register configured to change values of a double power mode setting signal for controlling the setting of the double power mode and a DVFS mode setting signal for controlling the setting of the DVFS mode, according to a mode register write command.

4. The power gating system according to claim 1, wherein when a power-down mode is set, the first and second power gating switches are turned off regardless of whether the double power mode is set.

5. A memory system comprising:
   a memory configured to selectively receive a first supply voltage from a first pad and selectively receive a second supply voltage from a second pad and to supply one of said supply voltages to a plurality of logic gates when a dynamic voltage frequency scaling (DVFS) mode is set, and supply both the first and second supply voltages to the plurality of logic gates at the same time when a double power mode is set; and
   a processor coupled to the memory and configured to supply the first and second supply voltages at different levels to the memory when the memory is set in the DVFS mode, and supply the first and second supply voltages to the memory at the same level when the memory is set in the double power mode.

6. The memory system according to claim 5, wherein when the memory is set in the DVFS mode, the processor supplies the first supply voltage at a high voltage level to the memory and supplies the second supply voltage at a lower voltage level than the first supply voltage to the memory,
   wherein when the memory is set in the double power mode, the processor supplies the first and second supply voltages at the high voltage level to the memory when the memory is set in the double power mode.

7. The memory system according to claim 5, wherein when the memory is set in the DVFS mode, the processor varies a voltage of the first and second supply voltages, which is supplied to the plurality of logic gates, by varying a setting value related to the DVFS mode.

8. The memory system according to claim 5, wherein the memory comprises:
   a first power line coupled to the first pad;
   a second power line coupled to the second pad;
   a third power line coupled to the plurality of logic gates in common;
   a first power gating switch coupled between the first and third power lines;
   a second power gating switch coupled between the second and third power lines; and
   a power gating control circuit configured to control the first and second power gating switches according to a double power mode setting signal, a DVFS mode setting signal and a power-down mode signal.

9. The memory system according to claim 8, further comprising a mode register configured to change a setting value of the double power mode and a setting value of the DVFS mode according to a mode register write command provided from the processor.

10. The memory system according to claim 8, further comprising a decoder configured to generate the power-down mode signal according to a power-down command provided from the processor.

11. The memory system according to claim 8, wherein when the power-down mode signal is at an active level, the power gating control circuit turns off the first and second power gating switches regardless of the levels of the double power mode setting signal and the DVFS mode setting signal.

12. The memory system according to claim 8, wherein when the power-down mode signal is at an inactive level and the double power mode setting signal is at an active level, the power gating control circuit turns on the first and second power gating switches regardless of the level of the DVFS mode setting signal.

13. The memory system according to claim 8, wherein when the power-down mode signal and the double power mode setting signal are all at an inactive level, the power gating control circuit selectively enables the first and second power gating switches according to the level of the DVFS mode setting signal.

14. A memory system comprising:
  a memory configured to selectively receive a first supply voltage applied through a first pad and receive a second supply voltage applied through a second pad, the first and second supply voltages being the same and provided to a plurality of logic gates therein at the same time when a double power mode for the memory is set; and
  a processor coupled to the memory and configured to supply the first and second supply voltages to the memory at the same level when the memory is set in the double power mode.

15. The memory system according to claim 14, wherein when the memory is set in the double power mode, the processor supplies the first and second supply voltages at the same high voltage level to the memory.

16. The memory system according to claim 14, wherein the memory comprises:
  a first power line coupled to the first pad;
  a second power line coupled to the second pad;
  a third power line coupled to the plurality of logic gates in common;
  a first power gating switch coupled between the first and third power lines;
  a second power gating switch coupled between the second and third power lines; and
  a power gating control circuit configured to control the first and second power gating switches according to a double power mode setting signal.

17. The memory system according to claim 16, further comprising a mode register configured to change a setting value of the double power mode according to a mode register write command provided from the processor.

* * * * *